United States Patent

Cheung et al.

[11] Patent Number: 5,814,560
[45] Date of Patent: Sep. 29, 1998

[54] METALLIZATION SIDEWALL PASSIVATION TECHNOLOGY FOR DEEP SUB-HALF MICROMETER IC APPLICATIONS

[75] Inventors: Robin W. Cheung, Cupertino; Simon S. Chan, Saratoga; Subhash Gupta, San Jose, all of Calif.

[73] Assignee: Advanced Micro Devices, Inc., Sunnyvale, Calif.

[21] Appl. No.: 564,752

[22] Filed: Nov. 29, 1995

[51] Int. Cl.⁶ .............................................. H01L 21/4763
[52] U.S. Cl. ............................................................ 438/648
[58] Field of Search ................................. 438/626, 627, 438/629, 681, 648, 688, 712, 720, 768

[56] References Cited

U.S. PATENT DOCUMENTS

| 5,332,693 | 7/1994 | Kim | 437/194 |
| 5,462,892 | 10/1995 | Gabriel | 437/189 |
| 5,476,815 | 12/1995 | Kawasumi | 437/192 |
| 5,571,751 | 11/1996 | Chung | 437/187 |
| 5,604,155 | 2/1997 | Wang | 437/190 |

FOREIGN PATENT DOCUMENTS 0 273 629  12/1987  European Pat. Off. .
0 614 217 A1  12/1993  European Pat. Off. .

Primary Examiner—Charles L. Bowers, Jr.
Assistant Examiner—Reneé R. Berry
Attorney, Agent, or Firm—Sawyer & Associates

[57] ABSTRACT

A method is provided for forming metal interconnect structures which resists the formation of pile-ups caused by electromigration. Each metal interconnect structure includes an aluminum interconnect sandwiched between two refractory metal layers. The method of the present invention involves forming a layer of aluminum intermetallic alloy on the sidewalls of the aluminum interconnects. The layer of aluminum intermetallic alloy provides reinforcement for the sidewalls. The layer of aluminum intermetallic alloy comprises aluminum-refractory metal alloy. The aluminum-refractory metal alloy is formed by reacting the exposed aluminum on the sidewalls with refractory metal-containing precursor material. After the formation of the layer of aluminum intermetallic alloy the sidewalls of the aluminum interconnects, the formation of pile-ups will be suppressed. Thus, the lifetime of the aluminum interconnects is extended. Accordingly, the method of the present invention improves the reliability and wear resistance of integrated circuits employing aluminum interconnects.

15 Claims, 1 Drawing Sheet

METALLIZATION SIDEWALL PASSIVATION TECHNOLOGY FOR DEEP SUB-HALF MICROMETER IC APPLICATIONS

TECHNICAL FIELD

The present invention relates generally to aluminum interconnects which are used for connecting IC (integrated circuit) devices formed in semiconductor wafers, and, more particularly, to electromigration-induced pile-up in aluminum interconnects.

BACKGROUND ART

Several trends in state of the art integrated circuit design have been proposed or are already being incorporated in current integrated circuits. In one approach, in order to increase integrated circuit speed, circuit designers have proposed to reduce the chip size, thereby lowering the RC time constant of the integrated circuits. In another approach, process technologists have proposed the use of low dielectric constant insulating material to lower the capacitive coupling between metal interconnects. In still another approach, the spacing between the metal interconnects in the same metal layer is becoming smaller and smaller in order to accommodate higher packing density.

Additionally, to accommodate higher packing density in present integrated circuits, metal connections to integrated circuit devices formed in a semiconductor substrate are made by multilayer interconnects. Aluminum-based metallization is typically used in current technology to form the metal layers which are patterned into the aluminum lines or aluminum interconnects. These aluminum interconnects are used to connect integrated circuit devices. Each level of multilayer interconnects is supported over the semiconductor substrate by an interlevel dielectric.

Low dielectric constant insulating material can be used to provide both lower inter-metal layer capacitance coupling and lower intra-metal layer capacitance coupling. Inter-metal layer capacitance coupling corresponds to capacitive coupling between different layers of aluminum separated by an interlayer dielectric. To lower the inter-metal capacitive coupling, low dielectric constant insulating material is used to form the interlayer dielectric. Intra-metal layer capacitance coupling corresponds to capacitive coupling between aluminum interconnects within a single layer of aluminum. To lower the intra-metal capacitive coupling, these aluminum interconnects are also separated by the low dielectric constant insulating material.

Use of low dielectric constant insulating material, as well as reduction in chip size and reduction in spacing between aluminum interconnects in the same layer of aluminum, all reduce the reliability of the integrated circuits. Integrated circuits which have incorporated these three trends in integrated circuit design have been reported to be sensitive to an electromigration failure mode. This electromigration failure mode involves the formation of lateral shorts between aluminum interconnects produced by electromigration. These lateral shorts are produced by the formation of pile-ups, hillocks, or extrusions in aluminum interconnects caused by electromigration.

Pile-ups, hillocks, and extrusions refer to a physical deformations in the aluminum interconnects. The terms "pile-up", "hillock", and "extrusion" are just different descriptions of the same observation. It will be readily apparent to those skilled in the art that these terms can be used interchangeably. In particular, these terms refer to the build-up of aluminum in one location of the aluminum interconnect. The build-up of aluminum in the case of the electromigration failure mode discussed above results from the transport of aluminum to one location via electromigration.

Low Young's modulus for low dielectric constant insulating materials is cited as the reason for the increased sensitivity to this electromigration failure mode. Young's modulus is generally low for low dielectric constant material. Accordingly, these low dielectric constant insulating materials are not strong enough to resist pile-up of material transported under electromigration.

The reduced chip size and the accompanying reduction in spacing between aluminum interconnects in the same layer of aluminum increases the likelihood that a pile-up will result in a lateral short.

Two solutions have been offered by many technologists to prevent the formation of the lateral shorts between aluminum interconnects as a result of electromigration. The first solution is to dope the aluminum-based metallization with alloying additions such as Cu, Ti, etc. Evidence shows that several such alloying additions retard the failure processes such as voiding and pile-up formation caused by electromigration. The second solution is to provide a strong liner comprising either $SiO_2$ or $Si_3N_4$ which surrounds each aluminum interconnect. The strong liner is deposited on the aluminum interconnects prior to the deposition of the low dielectric constant insulating material. The strong liner resists pile-up of aluminum transported via electromigration. Both solutions, however, have drawbacks.

The first solution may prevent the voiding and pile-up problems caused by electromigration. The effects of these alloying additions, however, on the stress-induced voiding failure mechanism is unclear. Stress-induced voiding is more complicated than electromigration-induced voiding. Stress-induced voiding arises due to the thermal mismatch of the materials employed in the formation of the aluminum interconnects and the surrounding dielectric. Voids form in the aluminum, thereby relaxing the stress caused by the thermal mismatch.

Another drawback of the use of alloyed-aluminum in the first solution is that the etchability of these new aluminum alloys is unclear.

The second solution is a workable solution. The trade-off, however, is more complex processing. Additionally, the effective dielectric constant of the resultant material system will be higher. The effective dielectric constant includes contributions from the dielectric constants for the low dielectric constant insulating material and for the strong liner. The dielectric constant for $Sio_2$ is about 4.0. The dielectric constant for $Si_3N_4$ is about 8.0. These values of the dielectric constants for $SiO_2$ and for $Si_3N_4$ exceed the values of the dielectric constants of low dielectric constant insulating materials. Accordingly, the effective dielectric constant, which as described above includes contributions from the constituent dielectrics, is higher than the dielectric constant of the low dielectric constant insulating material alone.

Thus, there remains a need for a method for preventing the formation of lateral shorts between aluminum interconnects caused by electromigration which avoids most, if not all, the foregoing problems.

DISCLOSURE OF INVENTION

In accordance with the invention, a method is provided for forming at least one metal interconnect structure which resists the formation of pile-ups caused by electromigration.

The metal interconnect structure is formed on an insulating layer formed over a semiconductor substrate. The method comprises the steps of:

(a) forming a first refractory metal layer on the insulating layer;

(b) forming a layer of aluminum on the first refractory metal layer;

(c) forming a second refractory metal layer on the layer of aluminum;

(d) patterning the second refractory metal layer, the layer of aluminum and the first refractory layer, thereby forming at least one aluminum interconnect sandwiched between the patterned first refractory metal layer and the patterned second refractory metal layer, each aluminum interconnect having sidewalls comprising exposed aluminum; and (e) forming a layer of aluminum intermetallic alloy comprising aluminum-refractory metal alloy on the sidewalls of the aluminum interconnects by reacting the exposed aluminum on the sidewalls with at least one refractory metal-containing precursor material, the layer of aluminum intermetallic alloy providing reinforcement for the sidewalls to enable the sidewalls to resist the formation of pile-ups caused by electromigration.

The method of the present invention provides a technique for strengthening the sidewalls of aluminum interconnects against the formation of electromigration-induced pile-ups. After the formation of the layer of aluminum intermetallic alloy on the sidewalls, the formation of pile-ups will be suppressed. Thus, the lifetime of the aluminum interconnects is extended despite electromigration. Accordingly, the method of the present invention improves the reliability and wear resistance of integrated circuits employing aluminum interconnects. The method of the present invention will be especially useful when used in conjunction with softer low dielectric constant insulating materials. Soft dielectric offers little resistance to the formation of pile-ups. Thus, softer low dielectric constant insulating materials are more susceptible to the formation of electromigration-induced lateral shorts.

The method of the present invention enables low dielectric constant insulating material to be used without sacrificing reliability and wear resistance of the aluminum interconnects. The used of low dielectric constant insulating material improves the signal-to-noise ratio of the integrated circuit. As described above, the use of the low dielectric constant insulating material reduces capacitance. Thus, the use of low dielectric constant insulating material provides lower coupling between interconnect lines. Lower coupling results in reduced overshoot and undershoot of signals. Accordingly, the signal-to-noise ratio is improved.

Finally, the method of the present invention provides an efficient means for strengthening the sidewalls of the aluminum interconnects. The present invention provides a method for providing sidewall reinforcement to resist the formation of pile-ups caused by electromigration that is simpler than prior art methods. The metal interconnect structure of the present invention involves simpler construction than prior art metal interconnect structures that provide sidewall reinforcement. Accordingly, the method for forming the metal interconnect structure of the present invention requires a simpler manufacturing process than prior art solutions for preventing the formation of electromigration-induced pile-ups and subsequent lateral shorts.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

Figure 1:
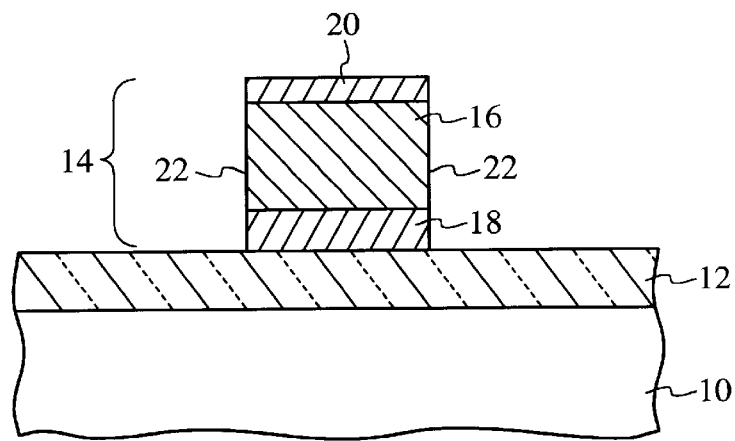
FIG. 1 is a cross-sectional view depicting a metal interconnect structure representative of a conventional metal interconnect. This metal interconnect structure is formed on an insulating layer formed over a semiconductor substrate.

Referring now to FIG. 1, wherein like reference numerals designate like elements throughout, a semiconductor substrate 10 is depicted having an insulation layer 12 formed thereon. A metal interconnect structure 14 is formed on the insulation layer 12. While one metal interconnect structure 14 is shown, it will be readily apparent to those skilled in the art that in fact any number of such metal interconnect structures are formed. The insulating layer 12 separates and electrically isolates the metal interconnect structure 14 from conducting regions (not shown) beneath the metal interconnect structure. These conductive regions may comprise doped regions in the semiconductor substrate 10, polysilicon, or patterned metal such as other metal interconnect structures 14. The insulating layer 12 may comprise field oxide formed on the semiconductor substrate 10 or may comprise an interlayer dielectric formed over the semiconductor substrate 10.

The metal interconnect structure 14 shown in FIG. 1 is representative of a conventional metal interconnect which is well-known in state of the art integrated circuits. The metal interconnect structure 14 comprises an aluminum interconnect 16 sandwiched between two refractory metal layers as is conventional for many aluminum interconnects. The refractory metal layers include a Ti/TiN stack (first refractory metal layer) 18, and an anti-reflection layer (second refractory metal layer) 20 comprising TiN, a layer of Ti and a layer TiN (i.e., Ti/TiN), or a TiN/Ti/TiN stack. The Ti/TiN stack 18 comprising the first refractory metal layer is on the bottom of the aluminum interconnect 16. The anti-reflection layer 20 comprising the second refractory metal layer is on the top of the aluminum interconnect 16.

Conventional processing techniques are employed to form the Ti/TiN stack 18, the aluminum interconnect 16, and the anti-reflection layer 20. Typically the Ti/TiN stack 18 is deposited, followed by the deposition of a layer of aluminum and the anti-reflection layer 20. A mask is formed on the anti-reflection layer 20. The mask (not shown) delineates a desired pattern for the metal interconnect structure 14. Conventional etching techniques are employed to etch the anti-reflection layer 20, the aluminum interconnect 16, and the Ti/TiN stack 18, thus forming the metal interconnect structure 14. FIG. 1 depicts the integrated circuit after the formation of the metal interconnect structure 14. With the Ti/TiN stack 18 on the bottom of the aluminum interconnect 16 and the anti-reflection layer 20 on the top of the aluminum interconnect, the sidewalls 22 of the aluminum interconnect are exposed. The exposed aluminum on the sidewalls 22 represents the weakest surfaces thereof Consequently, the exposed aluminum on the sidewalls 22 is prone to the formation of electromigration-induced pile-ups.

Figure 2:
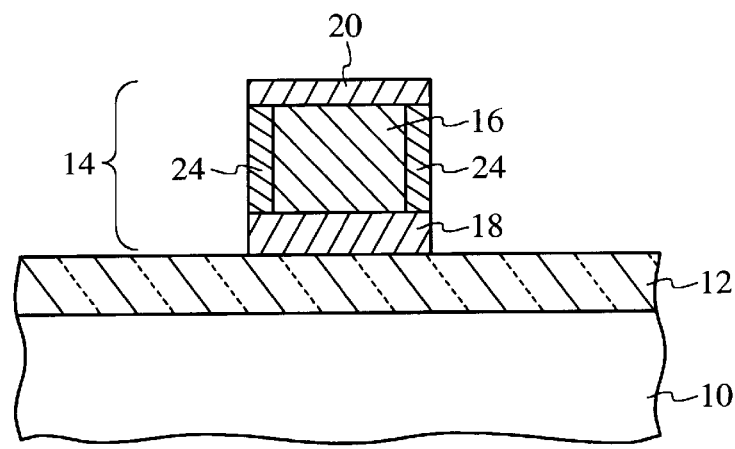
FIG. 2 is a cross-sectional view depicting a metal interconnect structure of the present invention. This metal interconnect structure is also formed on an insulating layer formed over a semiconductor substrate.

The method of the present invention consists of forming on the sidewalls 22 a thin layer of hard aluminum intermetallic alloy 24, as shown in FIG. 2. The thin layer of hard aluminum intermetallic alloy 24, comprises an aluminum-refractory metal alloy. Examples of aluminum-refractory metal alloys suitably employed as the layer of hard aluminum intermetallic alloy 24 include $TiAl_3$, $WAl_3$, and $WAl_6$. The layer of aluminum intermetallic alloy 24 is formed by allowing the exposed aluminum on the side walls 22 to react with an appropriate refractory metal-containing precursor material. Examples of materials suitably employed as refractory metal-containing precursor materials include titanium or tungsten-containing compounds.

A variety of these refractory metal-containing precursor materials exist in the form of metal organics or metal carbonyls. Examples of materials suitably employed as metal carbonyls include tungsten carbonyl, molybdenum carbonyl, chromium carbonyl, titanium carbonyl, nickel carbonyl, maganese carbonyl, and tantalum carbonyl. These metal organics or metal carbonyls can be delivered in gaseous form into a reaction chamber. Refractory metal-containing precursor materials are selected that will react with aluminum and not with Ti or TiN.

In one embodiment of the present invention, the aluminum interconnect 16 is exposed to the refractory metal-containing precursor material, which is in the form of metal organics or metal carbonyls. The metal organics or metal carbonyls are delivered in gaseous form into a reaction chamber containing the aluminum interconnect 16 formed over the semiconductor substrate 10. These metal organics or metal carbonyls are allowed to react with the exposed aluminum on the sidewalls 22, using a low temperature or plasma-enhanced reaction. A thermal cycle is employed which will form an aluminum-refractory metal alloy that resists the formation of the electromigration-induced pile-ups.

The melting point of the metal carbonyls are low, i.e., below 200° C. Additionally, some metal carbonyls such as chromium carbonyl and tungsten carbonyl sublime in vacuum. As such, triggering a reaction between the metal carbonyls and the exposed aluminum on the sidewalls 22 in a vacuum reaction chamber is not difficult. If the reaction rate is not high enough, plasma can be employed to enhance the reaction. Reaction energy is supplied in the form of plasma energy thereby speeding up the reaction rates.

Figure 3:
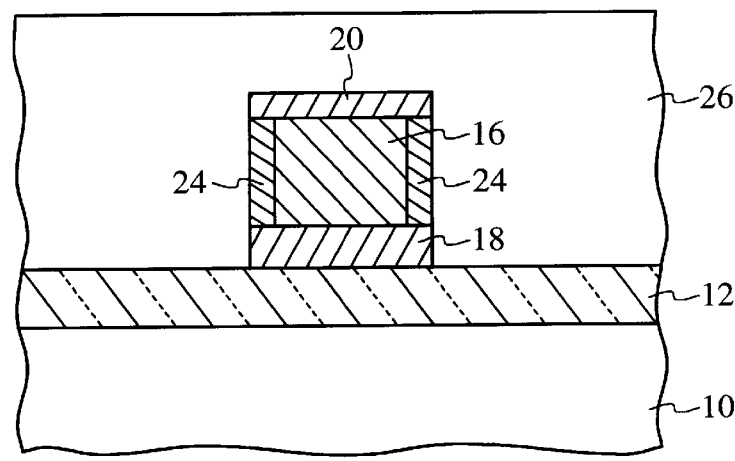
FIG. 3 is a cross-sectional view depicting a metal interconnect structure of the present invention after forming a layer of low dielectric constant insulating material on the metal interconnect structure and on the insulating layer.

As shown in FIG. 3, a layer of low dielectric constant insulating material 26 is then formed on the metal interconnect structure 14 and on the insulating layer 12. The layer of low dielectric constant insulating material 26 serves to electrically isolate the metal interconnect structure 14.

In another embodiment of the present invention, an alternative approach is employed to react the refractory metal-containing precursor material with the exposed aluminum on the sidewalls 22. The refractory metal-containing precursor material is not delivered in the form of gaseous metal organics or metal carbonyls. In this alternative embodiment, the layer of low dielectric constant insulating material 26 comprises a spin-on dielectric. The appropriate form of the refractory metal-containing precursor materials are added into the spin-on dielectric prior to deposition thereof. Examples of materials suitably employed as spin-on-dielectrics include spin-on glasses, polyimides, fluorinated polyimides, or other types of curable polymers.

In this alternative embodiment, as described above, a metal interconnect structure 14 such as the one shown in FIG. 1 is first formed.

The metal interconnect structure 14 comprises the aluminum interconnect 16 sandwiched between the Ti/TiN stack 18, and the anti-reflection layer 20. The Ti/TiN stack 18 is formed on the bottom of the aluminum interconnect 16. The anti-reflection layer 20 is formed on the top of the aluminum interconnect 16. As such, aluminum is exposed on the sidewalls 22 of the aluminum interconnect 16.

In this alternative embodiment, a spin-on dielectric containing a refractory metal-containing precursor material is then formed on the metal interconnect structure 14 and on the insulating layer 12. This spin-on dielectric serves as the layer low dielectric constant insulating material 26. The spin-on dielectric electrically isolates the metal interconnect structure 14.

The spin-on dielectric is cured at elevated temperatures. The preferred temperature for curing the spin-on dielectric is a temperature greater than about 350° C. The maximum cure temperature is typically limited to less than about 400° C. Temperatures higher than about 400° C. will cause the aluminum to form hillocks which is undesirable. Upon curing, the refractory metal-containing precursor material contained within the spin-on dielectric reacts with the exposed aluminum on the sidewalls 22 of the aluminum interconnect 16. This reaction between refractory metal-containing precursor material and the exposed aluminum on the sidewalls 22 forms the layer of aluminum intermetallic alloy 24. This layer of aluminum intermetallic alloy 24 comprises aluminum refractory alloy. As described above, this layer of aluminum intermetallic alloy 24 resists the formation of electromigration induced pile-ups. An example of aluminum refractory alloy suitably employed as the layer of aluminum intermetallic alloy 24 includes $TiAl_3$.

The refractory metal-containing precursor material added to the spin-on dielectric must be insulating itself Any unreacted fraction of the refractory metal-containing precursor material within the spin-on dielectric must remain insulating after curing. Accordingly, the insulating properties of the spin-on dielectric are not significantly compromised.

Process simplicity is provided by this alternative embodiment of the present invention. This alternative embodiment is no more complex than current processes for forming conventional metal interconnects which are not reinforced to prevent pile-up. No extra processing steps are involved in this alternative embodiment.

Both embodiments of the present invention provide a technique for strengthening the sidewalls 22 of aluminum interconnects 16 against the formation of electromigration-induced pile-ups. In the method of the present invention, the layer of aluminum intermetallic alloy 24 is harder than the aluminum employed to form the aluminum interconnects 16. After the formation of the layer of aluminum intermetallic alloy 24 on the sidewalls 22, the formation of pile-ups will be suppressed. The lifetime of aluminum-based metallization is extended despite electromigration. Thus, the method of the present invention improves the reliability and wear resistance of integrated circuits employing metal interconnects. The method of the present invention will be especially useful when used in conjunction with softer low dielectric constant insulating materials. The soft dielectric offers little resistance to the formation of pile-ups. Accordingly, softer low dielectric constant insulating materials are more susceptible to the formation of electromigration-induced lateral shorts.

The method of the present invention enables low dielectric constant insulating material to be used without sacrificing reliability and wear resistance of the aluminum interconnects 16. The used of low dielectric constant insulating material improves the signal-to-noise ratio of the integrated circuit. As described above, the use of the low dielectric constant insulating material reduces capacitance. Thus, the use of low dielectric constant insulating material provides lower coupling between interconnect lines. Lower coupling results in reduced overshoot and undershoot of signals. Accordingly, the signal-to-noise ratio is improved.

Finally, the method of the present invention provides an efficient means for strengthening the sidewalls 22 of the aluminum interconnects 16. The present invention provides a method for providing sidewall reinforcement to resist electromigration that is simpler than prior art methods. The metal interconnect structure 14 of the present invention involves simpler construction than prior art metal interconnect structures which resist the formation electromigration-induced pile-ups. Accordingly, the method for forming the metal interconnect structure 14 of the present invention requires a simpler manufacturing process than prior art solutions for preventing the formation electromigration-induced pile-ups.

INDUSTRIAL APPLICABILITY

The method of the invention for forming a metal interconnect structure 14 which resists the formation of pile-ups caused by electromigration is expected to find use in the fabrication of all deep sub-micrometer IC technology.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Many variations of films and materials are possible. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method for forming at least one metal interconnect structure which resists the formation of pile-ups caused by electromigration formed on an insulating layer formed over a semiconductor substrate, said method comprising the steps of:

(a) forming a first refractory metal layer on said insulating layer;

(b) forming a layer of aluminum on said first refractory metal layer;

(c) forming a second refractory metal layer on said layer of aluminum;

(d) patterning said second refractory metal layer, said layer of aluminum, and said first refractory layer thereby forming at least one aluminum interconnect sandwiched between said patterned first refractory metal layer and said patterned second refractory metal layer, each said aluminum interconnect having sidewalls comprising exposed aluminum; and (e) forming a layer of aluminum intermetallic alloy comprising aluminum-refractory metal alloy on said sidewalls of said aluminum interconnects by reacting said exposed aluminum on said sidewalls with at least one refractory metal-containing precursor material, said layer of aluminum intermetallic alloy providing reinforcement for said sidewalls to enable said sidewalls to resist the formation of pile-ups caused by electromigration.

2. The method of claim 1 wherein said first refractory metal layer comprises a Ti/TiN stack comprising a layer of Ti and a layer of TiN.

3. The method of claim 1 wherein said second refractory metal layer comprises an anti-reflection layer.

4. The method of claim 3 wherein said anti-reflection layer comprises a layer of TiN, a layer of Ti and a layer of TiN, or a TiN/Ti/TiN stack comprising a layer of Ti sandwiched between two layers of TiN.

5. The method of claim 1 wherein said refractory metal-containing precursor material is selected from the group of materials consisting of titanium-containing compounds and tungsten-containing compounds.

6. The method of claim 5 wherein said layer of aluminum intermetallic alloy comprises aluminum-refractory metal alloy selected from the group consisting of $TiAl_3$, $WAl_3$, and $WAl_6$.

7. The method of claim 1 wherein said refractory metal-containing precursor material reacts with aluminum but not with Ti or TiN.

8. The method of claim 1 wherein said refractory metal-containing precursor material comprises at least one metal organic or at least one metal carbonyl.

9. The method of claim 8 wherein said metal carbonyl is selected from the group consisting of tungsten carbonyl, molybdenum carbonyl, chromium carbonyl, titanium carbonyl, nickel carbonyl, maganese carbonyl, and tantalum carbonyl.

10. The method of claim 8 wherein said metal organic or said metal carbonyl is delivered in gaseous form into a reaction chamber containing said metal interconnect structure.

11. The method of claim 10 wherein said layer of aluminum intermetallic alloy is formed by reacting said exposed aluminum on said sidewalls with said refractory metal-containing precursor material in a low temperature reaction or a plasma-enhanced reaction.

12. The method of claim 11 wherein a layer of low dielectric constant insulating material is formed on said metal interconnect structure and on said insulating layer to electrically isolate said metal interconnect structure.

13. The method of claim 1 wherein said layer of aluminum intermetallic alloy is formed by a process comprising the steps of:

(a) forming a layer of spin-on-dielectric containing at least one refractory metal-containing precursor material on said metal interconnect structure and on said insulating layer to electrically isolate said metal interconnect structure; and (b) curing said layer of spin-on-dielectric at a temperature elevated above room temperature to cause said refractory metal-containing precursor material contained within said layer of spin-on-dielectric to react with said exposed aluminum on said sidewalls.

14. The method of claim 13 wherein said temperature is greater than about 350° C.

15. The method of 14 wherein said layer of spin-on-dielectric comprises material selected from the group consisting of spin-on-glass, curable polymers, polyimides, and fluorinated polyimides.

* * * * *